United States Patent
Midya et al.

[11] Patent Number: 6,137,358
[45] Date of Patent: *Oct. 24, 2000

[54] CLASS S RADIO FREQUENCY POWER AMPLIFIER

[75] Inventors: Pallab Midya, Schamburg, Ill.; Ronald Gene Myers, Scottsdale, Ariz.

[73] Assignee: Motorola, Inc., Schamburg, Ill.

[*] Notice: This patent is subject to a terminal disclaimer.

[21] Appl. No.: 09/046,041

[22] Filed: Mar. 23, 1998

[51] Int. Cl.[7] .................................................. H03G 3/30
[52] U.S. Cl. ............................... 330/136; 330/10; 330/149
[58] Field of Search ................................. 330/136, 207 A, 330/251, 127, 10, 297; 333/156, 204

[56] References Cited

U.S. PATENT DOCUMENTS

| | | | |
|---|---|---|---|
| 5,160,905 | 11/1992 | Hoang | 333/204 |
| 5,173,671 | 12/1992 | Wendler et al. | 333/204 |
| 5,668,511 | 9/1997 | Furutani et al. | 333/204 |
| 5,847,602 | 12/1998 | Su | 330/10 |
| 5,861,777 | 1/1999 | Sigmon et al. | 330/149 |

*Primary Examiner*—Michael B Shingleton
*Attorney, Agent, or Firm*—Bradley J. Botsch

[57] ABSTRACT

A radio frequency EER-type power amplifier is described in which pulse width modulation is utilized. Input rf signals are split into phase and amplitude paths by a delay line (210). The phase path is coupled to a power amplifier (260). The amplitude path includes an envelope detector (220) coupled to a class S amplifier (270). The class S amplifier is coupled to the power amplifier (260) via a transmission line implemented low pass filter (290). The low pass filter uses strip line transmission lines (410, 510) which may utilize magnetic material (520, 720) to enhance the operation of the low pass filter. The class S amplifier and a transmission line filter provide an amplified, high fidelity replica of the input rf signal.

15 Claims, 2 Drawing Sheets

CLASS S RADIO FREQUENCY POWER AMPLIFIER

FIELD OF THE INVENTION

This invention pertains to power amplifiers, in general, and to radio frequency (rf) power amplifiers, in particular.

BACKGROUND OF THE INVENTION

Various methods and apparatus are available for amplifying signals. In amplifier applications that involve the amplification and transmission of modulated signals, a premium is placed on amplifier efficiency. In addition, because many modulated signals contain information in the amplitude envelope and the phase of the signal, a premium is placed on the ability to create a high fidelity reproduction of the signal. In particular, an amplifier preferably exhibits very low amplitude distortion and very low phase distortion.

Communications devices, which often transmit signals having information in both amplitude and phase, are an example of an application where these qualities are in demand. Low distortion allows the communications devices to communicate more reliably, and high efficiency allows the devices to operate longer on a single battery.

One method of achieving increased efficiency is to use envelope elimination and restoration ("EER")-type amplifiers. EER is a technique through which highly efficient but nonlinear radio frequency ("rf") power can be combined with other, highly efficient amplifiers to produce a highly efficient linear amplifier system. The signal to be amplified is split into two paths: an amplitude path, and a phase path. The detected envelope is amplified efficiently in the amplitude path by a class S or other highly efficient power amplifier which only has to operate on the bandwidth of the rf envelope. The phase modulated carrier in the phase path is then amplitude modulated by the amplified envelope signal, creating an amplified replica of the input signal.

It is desirable to provide an EER amplifier with high efficiency.

BRIEF DESCRIPTION ON THE DRAWINGS

The invention will be better understood from a reading of the following detailed description taken in conjunction with the drawings in which like reference designations are used to identify like elements, and in which.

DETAILED DESCRIPTION

The present invention provides an improved EER amplifier arrangement. In EER power amplifier configurations, the power processing stages operate in a switching mode to maintain high efficiency. The envelope is removed from the rf signal and amplified by a class S modulator which operates directly on the power supply connection to the power amplifier. The class S modulator operates in the pulse width mode. The output of the class S modulator tracks the input rf envelope, but at a higher power level. The rf signal phase information is carried to the power amplifier in a separate path or channel. The class S modulator output is applied to the phase channel power amplifier stages through a low pass filter and the amplitude information is restored.

Class S modulators are pulsed width modulated systems which operate at a constant sampling frequency. In accordance with the principles of the invention, a low pass filter is implemented in a class S amplifier to increase the accuracy of the modulation process and produces superior performance. Implementation of the class S modulator low pass filter as a higher order filter using transmission line principles provides superior attenuation at higher sampling frequencies to increase bandwidth. The sampling frequency to bandwidth ratio for high efficiency class S modulators is thereby reduced. Generally, by providing a transmission line filter to remove certain undesired frequency components of the amplified envelope signal produced by a class S amplifier, an improved amplifier is obtained.

Figure 1:
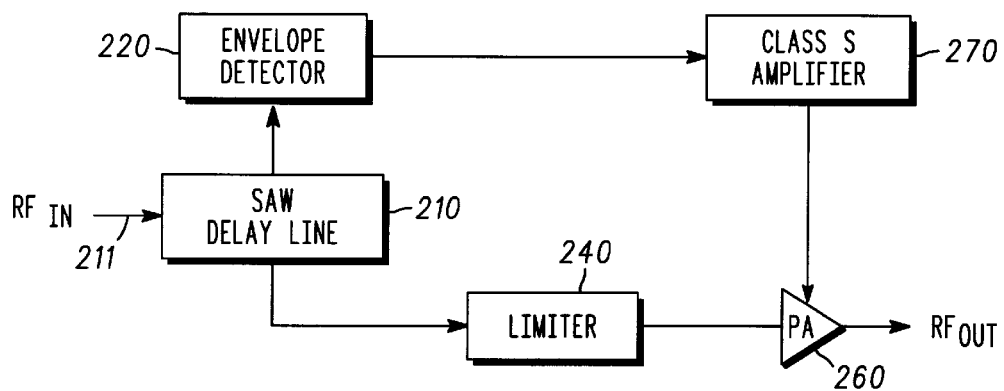
FIG. 1 is a block diagram of an amplifier in accordance with the principles of the invention.

Turning now to FIG. 1, an EER amplifier 10 includes delay line 210 which receives an rf signal at input 211. Delay line 210 may be of any conventional design for rf type delay lines. Delay line 210 splits the rf input signal into an amplitude portion which feeds envelope detector 220, and a phase portion which feeds limiter 240. Delay line 210 in the embodiment shown is a surface acoustic wave (saw) delay device with multiple output taps, each exhibiting a different delay from input to output, however, as those skilled in the art will appreciate, various other delay devices may be used.

The phase path of EER-type amplifier 10 includes limiter circuit 240 and power amplifier 260. Limiter 240 receives the signal output from delay line 210 and amplitude limits the signal. Limiter 240 preferably performs hard limiting so that the output signal of limiter 240 contains phase information with little or no amplitude information. However, in alternate embodiments limiter 240 can be omitted, or it can perform soft limiting. With the amplitude information removed from the input signal, the resultant signal is the phase modulated carrier of the rf input signal.

The phase modulated carrier output signal from limiter 240 is applied to the signal input of power amplifier 260. Power amplifier 260 is any rf power amplifier stage capable of being modulated. In the illustrative embodiment of the invention, the power amplifier 260 is a field effect transistor (FET) amplifier.

The amplitude path of EER-type amplifier 10 includes envelope detector 220 and class S amplifier 270. Envelope detector 220 detects the envelope of the rf signal applied to the delay line 210 and provides an envelope signal which represents the amplitude information contained in the original rf input signal. In effect, the envelope detector 220 extracts the amplitude information or envelope from the rf input signal. The envelope detector 220 is of any conventional envelope detector design and, for example, could be a diode detector. Other types of detectors, such as a synchronous detector based upon a double balanced mixer, could be also used as the envelope detector 210.

Class S amplifier 270 amplifies the envelope signal output from envelope detector 220 and drives the drain bias of power amplifier 260. Class S amplifier 270 amplifies the envelope signal to a level commensurate with the desired output. The output of the class S amplifier is the power supply for power amplifier 260, and the resultant modulation of the phase modulated carrier restores the envelope, producing an amplified replica of the input signal.

The EER-type amplifier of FIG. 1 varies the drain bias of power amplifier 260 in such a way as to maintain operation near saturation and therefore in a region of high efficiency. Because the highly efficient power amplifier 260 consumes the majority of the power consumed in EER-type amplifier 10, the entire circuit is considerably more efficient that conventional amplifiers.

Because class S amplifier 270 need only operate on the bandwidth of the envelope rather than at the much higher RF bandwidth of the RF amplifier, class S amplifier 270 can be an inexpensive and efficient amplifier with lower bandwidth requirements.

Figure 2:
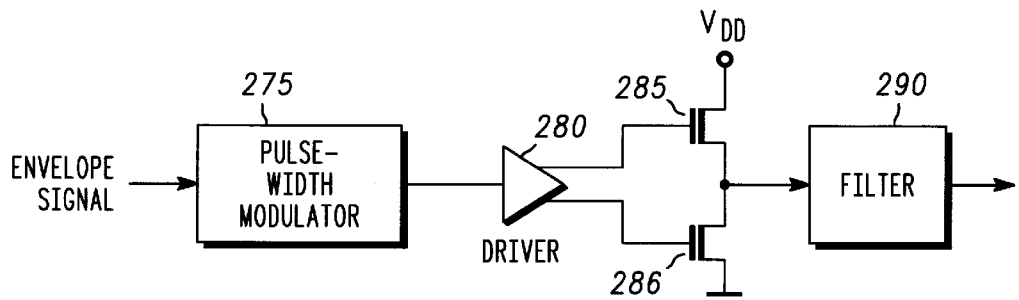
FIG. 2 is a detailed block diagram of a portion of the amplifier of FIG. 1.

FIG. 2 shows a block diagram of a class S amplifier in accordance with the present invention. Class S amplifier 270 includes pulse width modulator ("PWM") 275, driver 280, switching transistors 285 and 286 and transmission line filter 290.

PWM 275 receives the envelope signal extracted from the rf input signal and produces a pulse width modulated signal which has a duty cycle proportional to the amplitude of the envelope signal. The pulse width modulated signal is then fed to driver 280. Driver 280 has its complementary outputs coupled to switching transistors 285 and 286. Transistors 285 and 286 are driven by the driver to switch between supply voltage VDD and ground. Thus, the power voltage to the amplifier 260 of FIG. 1 is pulse width modulated. Low pass filter 290 is disposed between the transistors 285, 286 and the power amplifier 260.

Figure 3:
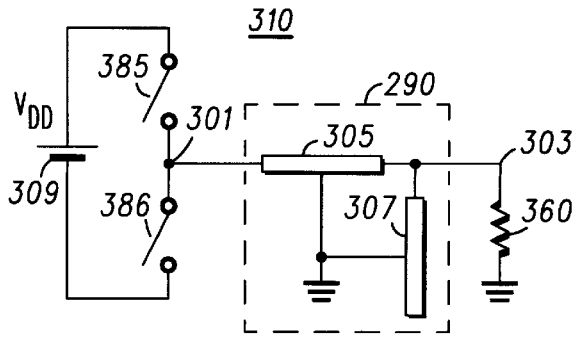
FIG. 3 is a schematic representation of a portion of the block diagram of FIG. 2.

FIG. 3 is a schematic representation of the switcher circuit portion 310 of class S amplifier 270. For purposes of simplification, the power source VDD is represented by battery 309; transistors 285 and 286 are represented by switches 385 and 386. The power amplifier 260 is represented by a load 360. Low pass filter 290 is in accordance with the principles of the invention is illustrated as comprising a transmission line filter having two quarter wave transmission lines 305 and 307. Battery 309 provides a potential of $V_{DD}$. Switches 385 and 386 operate simultaneously as a digital switch, switching between $V_{DD}$ and ground, thereby generating a pulse width modulated power signal at node 301. However, the signal at node 301 will contain a frequency component corresponding to the switching frequency or frequencies at which switches 385 and 386 are switched. A low pass filter 290 is used to remove these undesirable switching frequency components from the amplified envelope signal.

Transmission line filter 290 includes quarter wave transmission line implementations 305 and 307. At the switching frequency, the two transmission lines act as short and open circuits for the shunt and series element respectively. In principle, infinite attenuation is possible at the switching frequency. In practice, the switching frequency would be attenuated by more than 60 dB.

As shown in FIG. 3, transmission lines 305 and 307 implement a low pass filter which only attenuates frequencies above a certain cutoff frequency. Thus, frequencies greater than that cutoff frequency are attenuated by transmission line filter 290, thereby effectively removing those undesirable frequencies from the amplified envelope signal.

Figure 4:
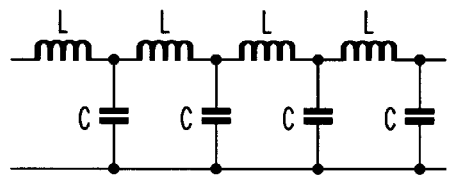
FIG. 4 is a circuit diagram of a lumped parameter model of the filter used in the amplifier of FIG. 1.

In operation, EER-type amplifiers may exhibit a significant delay time delay in the envelope amplifier because of the delay introduced in the low pass filter following the pulse width modulator. For example, in a system having an envelope bandwidth of between 10 MHz and 30 MHz, typical delays in the low pass filter range from 10 ns to 45 nanoseconds. Components in the phase path of EER-type amplifiers introduce small amounts of delay, but sum of the delays is generally substantially less than that of the low pass filter in the amplitude path. In order to recombine the envelope in the amplitude path with the carrier in the phase path without introducing significant distortion, the delay in the two paths should be substantially matched. The degree to which the delays in the amplitude and phase path of the EER-type amplifier should be matched is dependent, in part, on the desired signal fidelity at the output. Typical low pass filters utilize LC networks to achieve the desired level of high frequency attenuation. FIG. 4 shows a lumped parameter model of a low pass filter. The model includes four LC sections. The values for L and C are determined using conventional filter design techniques to produce the desired characteristics of the filter.

Figure 5:
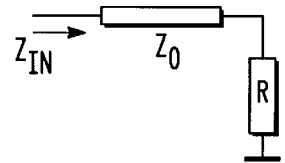
FIG. 5 is an equivalent circuit of the circuit of FIG. 3.

In order for transmission line filter 290 to remove the undesirable switching frequency used by switches 285 and 286 from the amplified envelope signal, that switching frequency must be adjusted such that it is greater than both the bandwidth of the amplified envelope signal and the cutoff frequency of filter 290. FIG. 5 illustrates an equivalent circuit from which the cutoff frequency of transmission line filter 290 is determined by its impedance $Z_0$.

Figure 6:
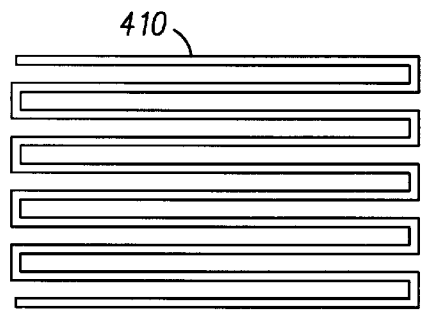
FIG. 6 is a strip line filter usable in the amplifier of FIG. 1.

It has been found that improved performance of the EER-type amplifier is improved by the use of a low pass filter which is implemented by using quarter wave transmission lines as shown in FIG. 3. The quarter wave transmission lines 305 and 307 can be implemented in the form of strip lines as shown in FIG. 6 and in FIG. 7. Strip line implementation 610 shown in FIG. 6 uses a "meander" geometry to achieve a desired physical length. Alternatively, strip line implementation 710 shown in FIG. 7 uses a "circular" geometry to achieve a desired physical length. The electrical lengths of strip line implementations 610 and 710 shown in FIGS. 6 and 7 equal each implementation's physical length multiplied by the square root of the product of the implementation's magnetic permeability times the implementation's dielectric constant. As is known, the strip lines 410 and 510 may be formed by forming the conductor patterns shown on printed circuit boards or can be implemented using any other technique for producing a strip line.

Figure 7:
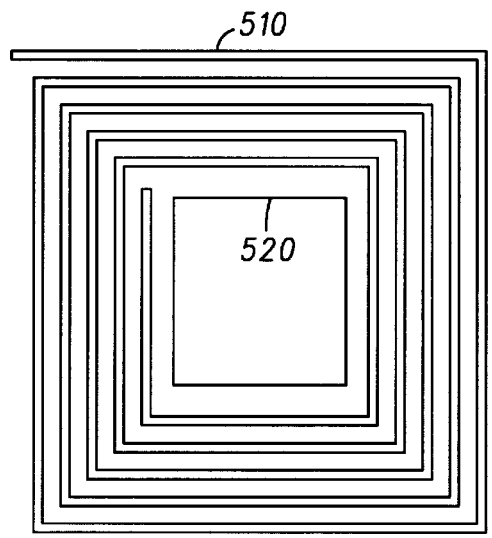
FIG. 7 is a second strip line filter useable in the amplifier of FIG. 1.

To achieve certain cutoff frequencies, the inductance is increased by adding magnetic material 520 adjacent the strip line conductors 510 comprising the transmission line filter as shown in FIG. 7.

Figure 8:
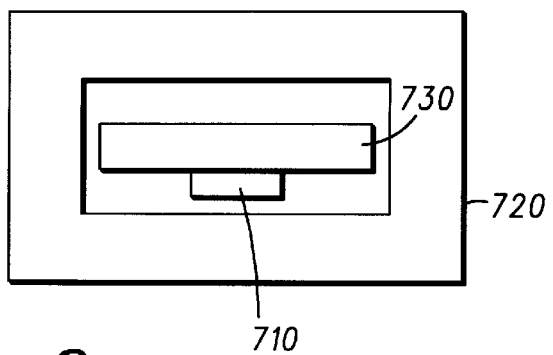
FIG. 8 is a cross sectional view of the strip line of FIG. 8.

Such magnetic materials could be incorporated into the transmission line filter by use of conventional magnetic materials deposited onto a strip line circuit board as shown in FIG. 8. In FIG. 8, the strip line transmission line comprises a metal pattern 710 deposited onto a substrate 730. The substrate is a printed circuit board substrate. As will be appreciated by those skilled in the art, the substrate could be selected from any of a number or commercially obtainable substrates used in electronic circuits. A magnetic material 720 is affixed to one or more surfaces of circuit board 730. The magnetic material may be deposited on the circuit board 730 by use of any one of several techniques commercially available to deposit magnetic materials.

Low profile, substantially planar magnetic cores can also be incorporated into a transmission line filter to increase the filter's inductance as shown in FIG. 7 by magnetic core 520.

As those skilled in the art will appreciate, such planar magnetic devices 520 can be affixed to a circuit board using conventional "through hole" circuit board technology, or using surface mount technology. Alternatively, such planar magnetic devices can be incorporated into a transmission line filter by injection molding the magnetic device into the circuit board itself.

The magnetic materials can be incorporated into the transmission line filter by use of coating, sputtering, screen printing, green tape, or other deposition techniques. Use of such deposition techniques would provide increased inductance to the transmission line filter by use of an extremely low profile magnetic device.

Implementation of transmission line filters in class S modulators has many advantages in performance characteristics. At higher operating frequencies necessary for wide band systems, filter losses can be reduced by selecting conductor thickness consistent with skin depth theory and by selecting low loss dielectric material for the substrate. Transmission line filter elements produce better attenuation characteristics than discrete filter components. Discrete components have more stray elements and spurious resonance frequencies, leading to degraded filter performance characteristics.

Transmission line filters have high volumetric efficiency and low weight achieved by integration of the elements into the circuit boards or substrates. Controlled processes produce consistent mechanical and electrical characteristics at low cost. Product reliability is enhanced.

As will be appreciated by those skilled in the art, the invention has been shown and described in terms of several embodiments and that various changes and modifications may be made without departing from the spirit or scope of the invention. It is intended that the invention not be limited to the embodiments shown but that it be limited in scope only by the claims appended hereto.

What is claimed is:

1. An EER-type amplifier, comprising:
    an input for receiving an input rf signal;
    a delay circuit, said delay circuit receiving said input rf signal, said delay circuit having a first output providing said rf signal delayed a first predetermined time, and a second output providing said rf signal delayed a second predetermined time;
    a power amplifier coupled to said second output, said power amplifier being operable to generate an output rf signal;
    an envelope detector coupled to said first output, to detect an envelope of said input rf signal and to generate an envelope signal;
    a class S amplifier coupled to said envelope detector and responsive to said envelope signal to produce a pulse width modulated signal corresponding to said input envelope signal; and
    a low pass filter coupling said class S amplifier to said power amplifier, said low pass filter comprises at least one strip line transmission line wherein use of said at least one transmission line allows the EER-type amplifier to operate efficiently at higher frequencies.

2. An amplifier in accordance with claim 1, wherein:
    said at least one strip transmission line comprises a conductor path disposed in a predetermined geometry.
3. An amplifier in accordance with claim 2, wherein:
    said strip line comprises a magnetic material disposed in proximity to said conductor path.
4. An amplifier in accordance with claim 1, wherein:
    said one strip line transmission line comprises a conductor path disposed in a meander geometry.
5. An amplifier in accordance with claim 1, wherein:
    said one strip line transmission line comprises a conductor path in a circular geometry.
6. An amplifier in accordance with claim 5, comprising:
    a magnetic media disposed in proximity to one of said one or more strip line transmission lines.
7. An amplifier in accordance with claim 6, wherein:
    said magnetic media comprises ferrite material.
8. An amplifier in accordance with claim 1, wherein:
    said delay circuit comprises a delay line.
9. An amplifier in accordance with claim 1, comprising:
    a limiter circuit disposed between said second output and said power amplifier.
10. An amplifier in accordance with claim 1, wherein:
    said class S amplifier comprises: a pulse width modulator for receiving said envelope signal and providing a first signal; electronic switch means operable by said first signal to modulate supply voltage provided to said power amplifier via said low pass filter.
11. An amplifier in accordance with claim 1, comprising:
    ferrite material in proximity to said strip line transmission line.
12. An amplifier in accordance with claim 11, wherein:
    said ferrite material is disposed in a substantially planar configuration.
13. A method for amplifying a signal, comprising the steps of:
    splitting an input signal into an envelope signal and a carrier signal;
    producing a pulse width modulated signal with a duty cycle proportional to said envelope signal;
    modulating a power supply voltage with said pulse width modulated signal;
    filtering said modulated power supply voltage with a low pass transmission line filter comprising at least one strip line transmission line wherein use of said at least one transmission line allows the EER-type amplifier to operate efficiently at higher frequencies;
    providing said carrier signal to a power amplifier; and
    modulating said power amplifier with said filtered power supply voltage to produce an amplified rf output signal.
14. A method in accordance with claim 13, wherein:
    said modulating step comprises controllably switching said power supply voltage with electronic switch means.
15. A method in accordance with claim 14, comprising:
    operating said switch means with said pulse width modulated signal.

* * * * *